United States Patent [19]

Lin

[11] Patent Number: 5,658,808

[45] Date of Patent: Aug. 19, 1997

[54] METHOD OF FABRICATING POLYCRYSTALLINE SILICON THIN-FILM TRANSISTOR HAVING SYMMETRICAL LATERAL RESISTORS

[75] Inventor: Kang-Cheng Lin, Taipei Hsien, Taiwan

[73] Assignee: Industrial Technology Research Institute, Hsin-Chu, Taiwan

[21] Appl. No.: 689,781

[22] Filed: Aug. 14, 1996

[51] Int. Cl.[6] .................. H01L 21/265; H01L 21/70; H01L 21/84

[52] U.S. Cl. .................. 438/155; 438/157; 438/384

[58] Field of Search .................. 437/21, 40, 41, 437/60, 918

[56] References Cited

U.S. PATENT DOCUMENTS

| | | | |
|---|---|---|---|
| 5,037,766 | 8/1991 | Wang | 437/24 |
| 5,372,958 | 12/1994 | Miyasaka et al. | 437/40 |
| 5,462,887 | 10/1995 | Gluck | 437/60 |
| 5,504,019 | 4/1996 | Miyasaka et al. | 437/40 |
| 5,529,937 | 6/1996 | Zhang et al. | 437/21 |

*Primary Examiner*—John Niebling
*Assistant Examiner*—Michael S. Lebentritt

[57] ABSTRACT

A method of fabricating a polycrystalline silicon thin-film transistor having two symmetrical lateral resistors is disclosed. Two sub-gates are formed along with a gate in the gate metal or polysilicon layer of the thin-film transistor. The two sub-gates that are located symmetrically on the two sides of the gate have equal distances to the gate. One sub-gate is near the drain of the thin film transistor and the other near the source. Two sections in the polycrystalline silicon layer of the thin film transistor are blocked by the two sub-gates and no impurity material is doped. The two undoped sections form the symmetrical lateral resistors of this invention. The lateral resistor near the drain decreases the electric field in the nearby depletion area when the thin-film transistor is switched off. The current leakage is reduced.

16 Claims, 3 Drawing Sheets

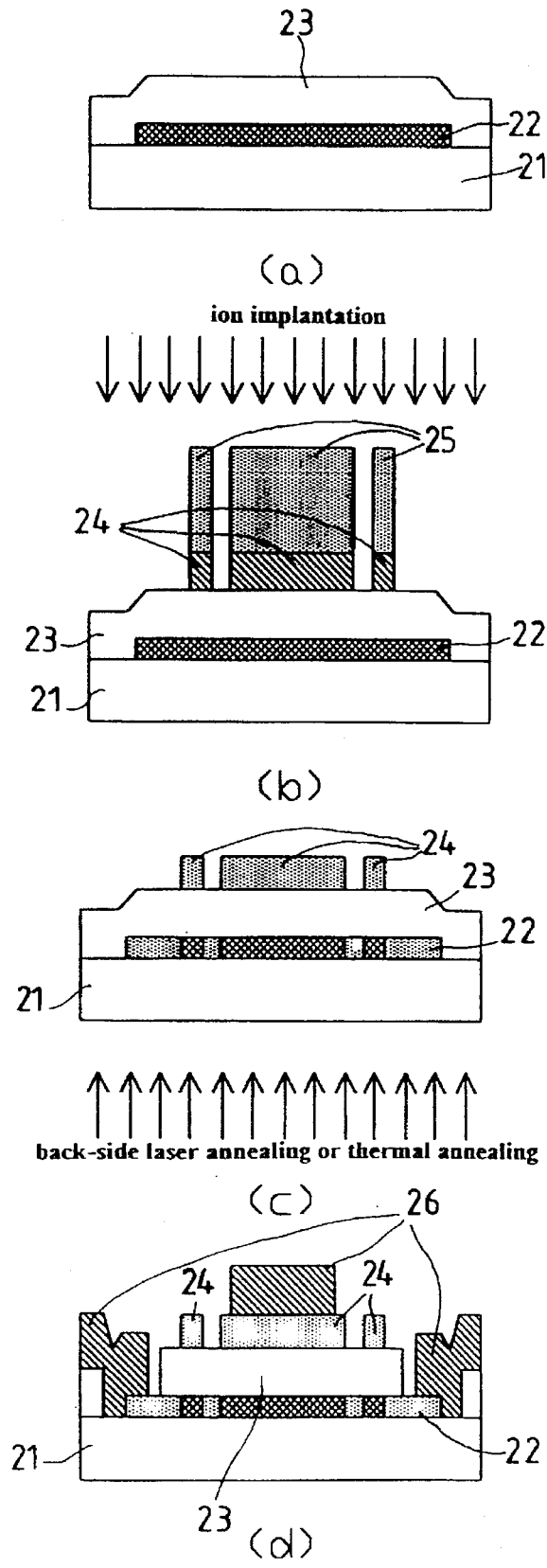
F I G.2

METHOD OF FABRICATING POLYCRYSTALLINE SILICON THIN-FILM TRANSISTOR HAVING SYMMETRICAL LATERAL RESISTORS

FIELD OF THE INVENTION

The present invention relates to the fabrication of a polycrystalline silicon thin-film transistor, and more specifically to the fabrication of a polycrystalline silicon thin-film transistor having symmetrical lateral resistors in both drain and source area.

BACKGROUND OF THE INVENTION

Thin-film transistor (TFT) liquid displays (LCDs) have been widely used in areas such as personal notebook computers, portable televisions and video camera monitors. The requirement in high quality and high density of the image pixels on the LCDs becomes more and more difficult to satisfy. The conventional process of fabricating thin-film transistor for LCDs using low electron mobility amorphous silicon (a-Si) material can no longer meet the requirement of a high quality display. It is necessary to use material with high electron mobility in fabricating thin-film transistors for LCDs. It is also important that similar thin-film transistors can be fabricated for a large size LCD. Therefore, polycrystalline silicon is an appropriate material for such an application.

When a polycrystalline silicon thin film transistor is used as a switching device for the LCD, electrical voltage difference $V_{DS}$ between the drain and the source can be as high as ±5 volts. The voltage difference mostly drops in the depletion area near the drain. A very large electric field is introduced in the depletion area. The electrons coming from the source are blocked by the depletion area. A large amount of electron holes are generated due to the collision into the depletion area by these electrons. Therefore, it is very likely for the electrons located in the drain area to recombine with the electron holes on the other side of the depletion area because of the energy gap provided by some defects in the material and the tunneling effect. Consequently, there can be a current leakage when the thin film transistor is turned off and the image quality of the LCD is degraded.

To solve the current leakage problem, the electrical field in the depletion area near the drain has to be reduced in order to minimize the possibility of the electron and hole recombination caused by the tunneling effect. One commonly used approach is to add an undoped offset area between the gate and the drain or a lightly doped drain area. Under this circumstance, most of the voltage difference drops in the added area. By adjusting the length of the added area, the electrical field in the area can be changed in order to reduce the current leakage. For thin-film transistors in an LCD, it is necessary that drain and the source are symmetrical and exchangeable so that the storage capacitance in the liquid crystal can be charged and discharged symmetrically to change polarity. Therefore, an undoped offset area or a lightly doped area near the source also has to be fabricated.

In making a large size high quality LCD, all the thin-film transistors should have the same characteristics. However, the undoped offset area or the lightly doped drain/source area may have different length which affects the threshold voltage, the sub-threshold swing, and the field effect carrier mobility of the thin-film transistor. This also results in changes in the characteristics of the transistor. In practice, it is not easy to maintain the same length for the two offset areas or lightly doped areas near the source and drain area. Trying to manufacture offset areas or lightly doped areas with the same length for a large number of thin-film transistors on the LCD is another difficult challenge.

SUMMARY OF THE INVENTION

The present invention has been made to overcome the above-mentioned difficulty in manufacturing polycrystalline silicon thin-film transistors having low current leakage and identical characteristics for an LCD. The primary object of this invention is to provide a method of forming symmetrical lateral resistors in the areas near the drain and the source of the thin-film transistor. Another object of this invention is to provide fabrication methods for manufacturing different types of thin-film transistors having symmetrical lateral resistors.

According to the present invention, a gate as well as two accompanied symmetrical sub-gates on the two sides of the gate on layer. Because of the existence of the sub-gates, when the polycrystalline silicon layer is doped to introduce impurity material in the drain and the source areas of the thin-film transistor, two symmetrical lateral resistors are also formed in the undoped sections covered by the sub-gates.

The voltage difference between the drain and the source has significant voltage dropped on the resistors of this invention. The voltage drop on the depletion area near the drain is greatly decreased. The electric field in the depletion area is also reduced. As described earlier, the current leakage can therefore be reduced. The resistors of this invention can be made symmetrical by using photo-lithographic technique. Consequently, thin-film transistors made by the methods of this invention have similar characteristics. When the thin-film transistors are manufactured as the switching devices in an active matrix LCD, all the pixels have similar high quality.

BRIEF DESCRIPTION OF THE DRAWINGS

FIGS. 2(A)–2(D) shows the cross-sectional views of an inverted polycrystalline silicon thin-film transistors of this invention in different manufacturing steps.

DETAILED DESCRIPTION OF THE PREFERRED EMBODIMENTS

According to the present invention, two sub-gates are formed along with the gate in the metal or polysilicon layer of a thin-film transistor. The existence of the two sub-gates prevents the corresponding areas in the polycrystalline silicon layer from being doped with impurity material. The two undoped areas near the drain and the source form the symmetrical lateral resistors of this invention. The principle of this invention can be applied to different types of thin-film transistors commonly adopted in manufacturing LCD device. The methods of fabricating thin-film transistors of three preferred embodiments are disclosed as follows.

I. Coplanar polycrystalline silicon thin film transistor

Figure 1:
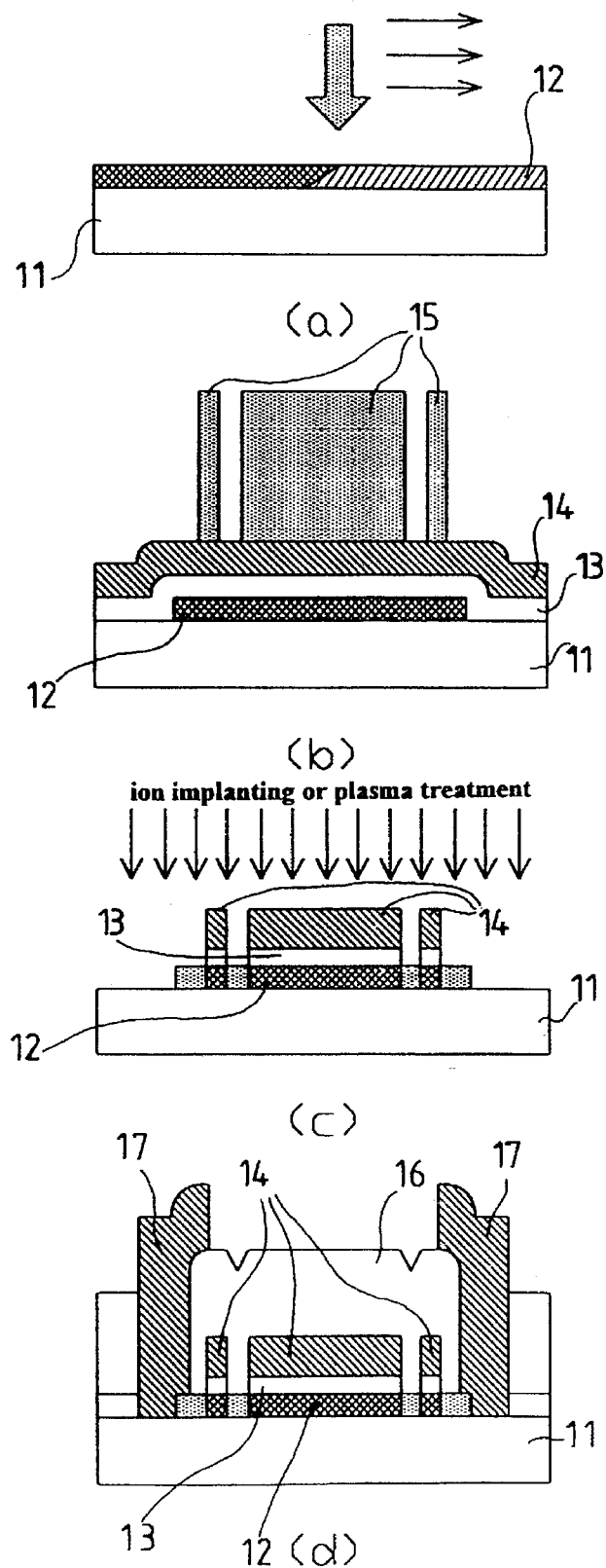
FIGS. 1(A)–1(D) hows the cross-sectional views of a coplanar polycrystalline silicon thin-film transistors of this invention in different manufacturing steps.

As shown in FIG. 1(a), an optically transparent substrate or a silicon substrate 11 is used for manufacturing the thin-film transistor of this invention. A layer of a-Si 12 is first deposited above the substrate 11 by plasma enhanced chemical vapor deposition (PECVD) or low pressure chemical vapor deposition (LPCVD). The a-Si layer can also be formed by sputtering in a vacuum chamber. The a-Si layer is then converted into a layer of polycrystalline silicon by a long period of thermal annealing or laser annealing. A semiconductor device area on the polycrystalline layer is defined and patterned for the thin-film transistor. An insulating layer 13 of amorphous silicon oxide (a-Sio$_x$) is formed on top of the polycrystalline silicon layer. The formation of the a-SiO$_x$ layer can be done by PECVD, LPCVD or sputtering in a vacuum chamber. The insulating layer can also be formed by growing a high temperature silicon oxide layer on top of the polycrystalline silicon layer. The polycrystalline layer is the active layer that comprises the drain, the source and the channel of the thin-film transistor.

After another long period of thermal annealing, a metal or polysilicon layer 14 is deposited above the insulating layer 13. A photo-resist layer 15 as shown in FIG. 1(b) is formed and patterned above the metal or polysilicon layer that has a gate area and two sub-gate areas defined thereon. The two sub-gate areas are located symmetrically to each other on the two sides of the gate. One sub-gate is between the gate and the drain of the transistor and the other is between the gate and the source of the transistor. The smallest distances between the gate area and the two sub-gate areas are identical on both sides. The gate and sub-gate structure is formed by etching the metal or polysilicon layer. The insulating layer is also etched, leaving only the areas below the gate and the two sub-gates. The areas above the drain and the source are also removed. The photo-resist layer is removed after etching.

As illustrated in FIG. 1(c), the doping of the drain and the source for forming p$^+$ or n$^+$ type thin film transistor is accomplished by ion implantation or plasma treatment of the impurity material. The gate and sub-gates are used as the blocking layer to stop the ion implantation or diffusion into the active layer of the thin-film transistor. The impurity material in the drain, the source and the areas between the gate and the sub-gates is then activated by thermal annealing or back-side laser annealing from the back of the transparent substrate. A passivation layer 16 is deposited to cover the thin-film transistor. Contact holes for the drain, the source and the gate are formed. The metal wires 17 for contacting the drain, the source and the gate are deposited. The coplanar polycrystalline silicon thin-film transistor having symmetrical lateral resistors as shown in FIG. 1(d) is thus fabricated.

II. Inverted polycrystalline silicon thin film transistor

The early process for manufacturing the inverted polycrystalline silicon thin film transistor is similar to that of manufacturing the coplanar thin film transistor discussed above. With reference to FIG. 2(a), an optically transparent substrate 21 or a silicon substrate is used for manufacturing the thin-film transistor of this invention. A layer of a-Si is first deposited above the substrate by PECVD or LPCVD. The a-Si layer can also be formed by sputtering in a vacuum chamber. The a-Si layer is then converted into a layer of polycrystalline silicon 22 by a long period of thermal annealing or laser annealing. A semiconductor device area on the polycrystalline layer is defined and patterned for the thin-film transistor. The polycrystalline layer is the active layer that comprises the drain, the source and the channel of the thin-film transistor. An insulating layer 23 of a-SiO$_x$ is formed on top of the polycrystalline silicon layer. The formation of the a-SiO$_x$ layer can be done by PECVD, LPCVD or sputtering in a vacuum chamber. The insulating layer can also be formed by growing a high temperature silicon oxide layer on top of the polycrystalline silicon layer.

After a long period of thermal annealing process, a metal or polysilicon layer 24 is deposited above the insulating layer 23. A gate area and two sub-gate areas are defined and formed by a conventional photo-lithographic technique and an etching process. FIG. 2(b) shows a photo-resist layer 25 defining the gate and sub-gate areas. The photo-resist layer 25 is not removed after etching the metal or polysilicon layer 24. The two sub-gate areas are located symmetrically to each other on the two sides of the gate. One sub-gate is between the gate and the drain of the transistor and the other is between the gate and the source of the transistor. The smallest distances between the gate area and the two sub-gate areas are identical on both sides. The gate and sub-gate structure is formed after etching the metal or polysilicon layer as shown in FIG. 2(b).

As illustrated in FIG. 2(b), the doping of the drain and the source for forming p$^+$ or n$^+$ type thin film transistor is accomplished by ion implantation or plasma treatment of the impurity material before the photo-resist layer 25 is removed. The photo-resist layer, the gate and sub-gates are used as the blocking layer to stop the ion implantation or diffusion into the active layer of the thin-film transistor. After removing the photo-resist layer 25, the impurity material in the drain area, the source area and the areas between the gate and the sub-gates is then activated by using thermal annealing or back-side laser annealing from the back of the transparent substrate as shown in FIG. 2(c). Contact holes for the drain and the source are formed through the insulating layer 23. The metal wires 26 for contacting the drain, the source and the gate are deposited. The inverted polycrystalline silicon thin-film transistor having symmetrical lateral resistors is thus fabricated as shown in FIG. 2(d).

III. Inverted staggered polycrystalline silicon thin film transistor

Figure 3:
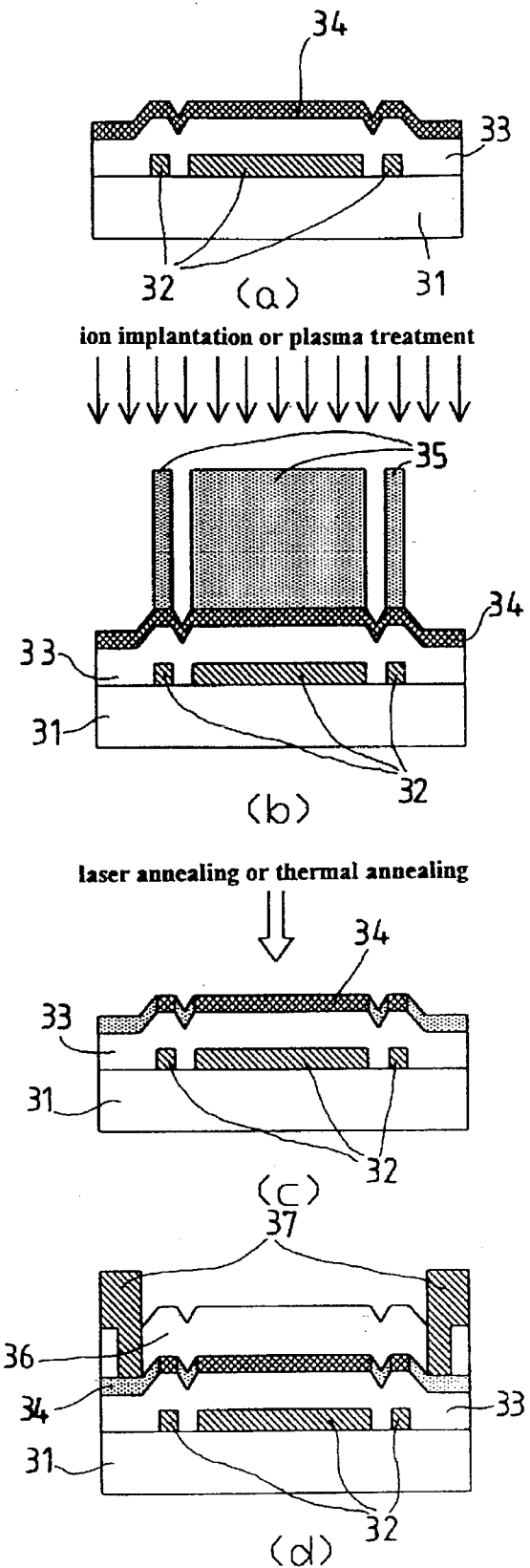
FIGS. 3(A)–3(D) shows the cross-sectional views of an inverted staggered polycrystalline silicon thin-film transistors of this invention in different manufacturing steps.

As shown in FIG. 3(a), an optically transparent substrate 31 is used for manufacturing the thin-film transistor of this invention. A layer of metal or polysilicon 32 is first deposited above the substrate. The metal or polysilicon layer 32 is then patterned and etched by a conventional photo-lithographic technique and an etching process to establish a gate and two sub-gates as shown in the figure. The two sub-gate areas are on the two sides of the gate and symmetrical to each other. The smallest distances between the gate area and the two sub-gate areas are identical on the two sides.

An insulating layer 33 of amorphous silicon oxide is formed to cover the patterned gate layer 32 and the substrate 31. The formation of the a-SiO$_x$ layer can be done by either PECVD or LPCVD or by sputtering in a vacuum chamber. An amorphous silicon a-Si layer 34 is then deposited on top of the insulating layer 33 as illustrated in FIG. 3(a). The a-Si layer can be formed by either PECVD or LPCVD or by sputtering in a vacuum chamber. The a-Si layer is then converted into a layer of polycrystalline silicon by thermal annealing or laser annealing.

A photo-resist layer 35 is formed on top of the polycrystalline silicon layer 34. A fully self-aligned back-side exposure method is then used to expose the photo-resist layer and define the semi-conductor device area as shown in FIG. 3(b). The unexposed photo-resist layer 35 serves as the blocking layer for the following ion implanting or plasma treatment process. The doping of the drain and the source for forming p⁺ or n⁺ type thin film transistor is accomplished by ion implantation or plasma treatment of the impurity material. The photo-resist layer 35 is then removed after the doping process. The impurity material in the drain area, the source area or the areas between the gate and the two sub-gates is then activated by using thermal annealing or laser annealing as shown in FIG. 3(c).

A passivation layer 36 is deposited to cover the thin-film transistor. Contact holes for the drain, the source and the gate are formed through the passivation layer 36. The metal wires 37 for contacting the drain, the source and the gate are deposited. The inverted staggered polycrystalline silicon thin-film transistor having symmetrical lateral resistors as shown in FIG. 3(d) is thus fabricated.

What is claimed is:

1. A method of fabricating a polycrystalline silicon thin-film transistor having symmetrical lateral resistors, comprising the steps of:

preparing a silicon substrate or an optically transparent substrate;

depositing an amorphous silicon layer above said substrate;

converting said amorphous silicon layer into a polycrystalline silicon layer by an annealing process;

patterning said polycrystalline silicon layer and defining a device area for said thin-film transistor;

forming an insulating layer on top of said polycrystalline silicon layer;

depositing a metal or polysilicon layer above said insulating layer;

forming and patterning a photo-resist layer above said metal or polysilicon layer for covering the areas above a gate and two sub-gates of said metal or polysilicon layer, said photo-resist layer having openings defining drain, source and areas between said gate and said sub-gates for said polycrystalline silicon layer, and said sub-gates being located symmetrically on the two sides of said gate and having equal distances to said gate;

etching said metal or polysilicon layer and said insulating layer to expose said polycrystalline silicon layer;

removing said photo-resist layer;

doping said polycrystalline silicon layer to add impurity material to said drain, said source, and the areas between said gate and said sub-gates, said metal or polysilicon layer and said insulating layer serving as blocking layers;

annealing and activating said impurity material;

forming a passivation layer covering said device area over said substrate, said polycrystalline silicon layer, and said metal or polysilicon layer;

establishing contact holes through said passivation layer for said drain, said source and said gate;

and forming metal wiring for contacting said drain, said source and said gate;

wherein said polycrystalline silicon layer has two undoped sections below said sub-gates and said undoped sections form two symmetrical lateral resistors.

2. The method of fabricating a polycrystalline silicon thin-film transistor having symmetrical lateral resistors according to claim 1, wherein the annealing process for converting said amorphous silicon layer into said polycrystalline silicon layer is accomplished by laser annealing or thermal annealing.

3. The method of fabricating a polycrystalline silicon thin-film transistor having symmetrical lateral resistors according to claim 1, wherein said insulating layer comprises amorphous silicon oxide.

4. The method of fabricating a polycrystalline silicon thin-film transistor having symmetrical lateral resistors according to claim 1, wherein doping said polycrystalline silicon layer is accomplished by an ion implantation process or a plasma treatment.

5. The method of fabricating a polycrystalline silicon thin-film transistor having symmetrical lateral resistors according to claim 1, wherein annealing and activating said impurity material is accomplished by back-side laser annealing or thermal annealing.

6. A method of fabricating a polycrystalline silicon thin-film transistor having symmetrical lateral resistors, comprising the steps of:

preparing a silicon substrate or an optically transparent substrate;

depositing an amorphous silicon layer above said substrate;

converting said amorphous silicon layer into a polycrystalline silicon layer by an annealing process;

patterning said polycrystalline silicon layer and defining a device area for said thin-film transistor;

forming an insulating layer on top of said polycrystalline silicon layer;

depositing a metal or polysilicon layer above said insulating layer;

forming and patterning a photo-resist layer above said metal or polysilicon layer for covering the areas above a gate and two sub-gates of said metal or polysilicon layer, said photo-resist layer having openings defining drain, source and areas between said gate and said sub-gates for said polycrystalline silicon layer, and said sub-gates being located symmetrically on the two sides of said gate and having equal distances to said gate;

etching said metal or polysilicon layer to expose said insulating layer;

doping said polycrystalline silicon layer to add impurity material to said drain, said source, and the areas between said gate and said sub-gates, said metal or polysilicon layer and said photo-resist layer serving as blocking layers;

removing said photo-resist layer;

annealing and activating said impurity material;

establishing contact holes through said insulating layer for said drain, and said source;

and forming metal wiring for contacting said drain, said source and said gate;

wherein said polycrystalline silicon layer has two undoped sections below said sub-gates and said undoped sections form two symmetrical lateral resistors.

7. The method of fabricating a polycrystalline silicon thin-film transistor having symmetrical lateral resistors according to claim 6, wherein the annealing process for converting said amorphous silicon layer into said polycrystalline silicon layer is accomplished by laser annealing or thermal annealing.

8. The method of fabricating a polycrystalline silicon thin-film transistor having symmetrical lateral resistors according to claim 6, wherein said insulating layer comprises amorphous silicon oxide.

9. The method of fabricating a polycrystalline silicon thin-film transistor having symmetrical lateral resistors according to claim 6, wherein doping said polycrystalline silicon layer is accomplished by ion implantation.

10. The method of fabricating a polycrystalline silicon thin-film transistor having symmetrical lateral resistors according to claim 6, wherein annealing and activating said impurity material is accomplished by back-side laser annealing or thermal annealing.

11. A method of fabricating a polycrystalline silicon thin-film transistor having symmetrical lateral resistors, comprising the steps of:

preparing an optically transparent substrate;

depositing a metal or polysilicon layer above said substrate;

patterning and etching said metal or polysilicon layer for forming a gate and two sub-gates in said metal or polysilicon layer, said sub-gates being located symmetrically on the two sides of said gate and having equal distances to said gate;

forming an insulating layer on top of said gate, said sub-gates and said substrate;

depositing an amorphous silicon layer above said insulating layer;

converting said amorphous silicon layer into a polycrystalline silicon layer by an annealing process;

forming and patterning a photo-resist layer above said polycrystalline silicon layer for covering the area above said gate and said two sub-gates, said photo-resist layer having openings defining drain, source and areas between said gate and said sub-gates for said polycrystalline silicon layer;

doping said polycrystalline silicon layer to add impurity material to said drain, said source, and said areas between said gate and said sub-gates through said openings of said photo-resist layer;

removing said photo-resist layer;

annealing and activating said impurity material;

forming a passivation layer over said polycrystalline silicon layer;

establishing contact holes through said passivation layer for said drain, said source and said gate;

and forming metal wiring for contacting said drain, said source and said gate;

wherein said polycrystalline silicon layer has two undoped sections above said sub-gates and said undoped sections form two symmetrical lateral resistors.

12. The method of fabricating a polycrystalline silicon thin-film transistor having symmetrical lateral resistors according to claim 11, wherein said insulating layer comprises amorphous silicon oxide.

13. The method of fabricating a polycrystalline silicon thin-film transistor having symmetrical lateral resistors according to claim 11, wherein the annealing process for converting said amorphous silicon layer into said polycrystalline silicon layer is accomplished by laser annealing or thermal annealing.

14. The method of fabricating a polycrystalline silicon thin-film transistor having symmetrical lateral resistors according to claim 11, wherein the process of patterning said photo-resist layer comprises a back-side exposure process using said metal or polysilicon layer as a self-aligned mask.

15. The method of fabricating a polycrystalline silicon thin-film transistor having symmetrical lateral resistors according to claim 11, wherein doping said polycrystalline silicon layer is accomplished by an ion implantation process or a plasma treatment.

16. The method of fabricating a polycrystalline silicon thin-film transistor having symmetrical lateral resistors according to claim 11, wherein annealing and activating said impurity material is accomplished by laser annealing or thermal annealing.

* * * * *